United States Patent [19]
Olbright et al.

[11] Patent Number: 5,258,990
[45] Date of Patent: Nov. 2, 1993

[54] VISIBLE LIGHT SURFACE EMITTING SEMICONDUCTOR LASER

[75] Inventors: Gregory R. Olbright, Boulder, Colo.; Jack L. Jewell, Bridgewater, N.J.

[73] Assignee: The United States of America as represented by the Secretary of the United States Department of Energy, Washington, D.C.

[21] Appl. No.: 790,964

[22] Filed: Nov. 7, 1991

[51] Int. Cl.⁵ .............................................. H01S 3/19
[52] U.S. Cl. ...................................... 372/46; 372/43; 372/45; 372/96; 372/99
[58] Field of Search ....................... 372/45, 46, 92, 96, 372/43, 99

[56] References Cited

U.S. PATENT DOCUMENTS

| | | | |
|---|---|---|---|
| 4,660,207 | 4/1987 | Svilans | 374/45 |
| 4,675,875 | 6/1987 | Takamiya | 372/45 |
| 4,675,876 | 6/1987 | Svilans | 372/96 |
| 4,675,877 | 6/1987 | Svilans | 372/96 |
| 4,873,696 | 10/1989 | Coldren et al. | 372/96 |
| 4,901,327 | 2/1990 | Bradley | 372/45 |
| 4,943,970 | 7/1990 | Bradley | 372/45 |
| 4,949,350 | 8/1990 | Jewell et al. | 372/45 |
| 4,949,351 | 8/1990 | Imanaka | 372/45 |
| 4,991,179 | 2/1991 | Deppe et al. | 372/45 |
| 4,999,842 | 3/1991 | Huang et al. | 372/45 |
| 5,020,066 | 5/1991 | Iga et al. | 372/45 |
| 5,034,344 | 7/1991 | Jewell et al. | 437/129 |
| 5,034,958 | 7/1991 | Kwon et al. | 372/45 |
| 5,038,356 | 8/1991 | Botez et al. | 372/45 |
| 5,052,016 | 9/1991 | Mahbobzadeh et al. | 372/96 |
| 5,063,569 | 11/1991 | Xie | 372/45 |
| 5,146,465 | 9/1992 | Khan et al. | 372/43 |

OTHER PUBLICATIONS

Soda et al., "GaInAsP/InP Surface Emitting Injection Lasers," *Japan. J. Appl. Phys.*, vol. 18, Dec., 1979, pp. 2329–2330.
Iga et al., "Surface Emitting Semiconductor Lasers," *IEEE J. Quantum Electron.*, vol. 24, Sep., 1988, pp. 1845–1855.
Jewell et al., "Vertical Cavity Single Quantum Well Laser," *Appl. Phys. Lett.*, vol. 55, Jul., 1989, pp. 424–426.
Jewell et al., "Low Threshold Electrically-Pumped Vertical Cavity Emitting Micro-lasers," *Electronic Letters*, vol. 25, Aug., 1989, pp. 1123–1124.
Jewell et al., "Vertical Cavity Lasers for Optical Interconnects," *SPIE Vol. 1389 International Conference on Advances in Interconnection and Packaging*, 1990, pp. 401–407.
Lee et al., "Top-Surface-Emitting GaAs Four-Quantum-Well Lasers Emitting at 0.85 μm," *Electronic Letters*, vol. 26, May, 1990, pp. 710–711.
Yoo et al., "Low Series Resistance Vertical-Cavity Front-Surface-Emitting Diode," *Appl. Phys. Letters*, vol. 56, No. 20, May, 1990, pp. 1942–1945.
Olbright et al., "Cascadable Laser Logic Devices: Discrete Integration of Phototransistors with Surface Emitting Laser Diodes," *Electronics Letters*, vol. 27, No. 3, Jan. 31, 1991, pp. 216–217.
Jewell et al., "Vertical-Cavity Surface-Emitting Lasers: Design, Growth, Fabrication, Characterization," *IEEE Journal of Quantum Electronics*, vol. 27, No. 6, Jun., 1991, pp. 1332–1346.
Jewell et al., "Microlasers," *Scientific American*, vol. 265, No. 5, Nov., 1991, pp. 86–96.

Primary Examiner—James W. Davie
Attorney, Agent, or Firm—Karla Ojanen; James H. Chafin; William R. Moser

[57] ABSTRACT

A vertical-cavity surface-emitting laser is disclosed comprising a laser cavity sandwiched between two distributed Bragg reflectors. The laser cavity comprises a pair of spacer layers surrounding one or more active, optically emitting quantum-well layers having a bandgap in the visible which serve as the active optically emitting material of the device. The thickness of the laser cavity is m $\lambda/2n_{eff}$ where m is an integer, $\lambda$ is the free-space wavelength of the laser radiation and $n_{eff}$ is the effective index of refraction of the cavity. Electrical pumping of the laser is achieved by heavily doping the bottom mirror and substrate to one conductivity-type and heavily doping regions of the upper mirror with the opposite conductivity type to form a diode structure and applying a suitable voltage to the diode structure. Specific embodiments of the invention for generating red, green, and blue radiation are described.

4 Claims, 5 Drawing Sheets

VISIBLE LIGHT SURFACE EMITTING SEMICONDUCTOR LASER

FIELD OF THE INVENTION

This relates to semiconductor lasers and, in particular, to vertically arranged heterostructure lasers that emit electromagnetic radiation in the visible spectrum (i.e., in the range between 400 and 700 nanometers).

BACKGROUND OF THE INVENTION

Conventional edge-emitting laser diodes are well known. In these diodes, laser radiation is emitted in a plane that is a continuation of the plane of the p-n junction that forms the diode. Different types of these diodes are widely used to provide laser radiation in the infrared and visible regions. While these diodes have enjoyed considerable commercial success, they are relatively large and, as a result, are difficult to integrate with other devices.

Recently, a new class of semiconductor lasers known as a vertical cavity surface emitting laser has been developed. Unlike the edge-emitting laser, these vertical cavity lasers emit laser radiation in the direction perpendicular to the plane of the p-n junction formed in the laser diode. Considerable information concerning the structure and formation of such laser diodes is set forth, for example, in U.S. Pat. No. 4,949,350; in J. Jewell et al., "Microlasers," *Scientific American*, Vol. 265, No. 5, pp. 86–94 (November 1991); in J. Jewell et al., "Vertical-Cavity Surface-Emitting Lasers: Design, Growth Fabrication, Characterization," *IEEE Journal of Quantum Electronics*, Vol. 27, No. 6, pp.1332–1346 (June 1991); in G. R. Olbright et al., "Cascadable Laser Logic Devices: Discrete Integration of Phototransistors with Surface-Emitting Laser Diodes," *Electronics Letters*, Vol. 27, No. 3, pp.216–217 (Jan. 31, 1991); and in J. Jewell et al., "Vertical Cavity Lasers for Optical Interconnects," SPIE Vol. 1389 *International Conference on Advances in Interconnection and Packaging*, pp. 401–407 (1990), all of which are incorporated herein by reference.

As set forth in certain of the above-referenced publications, vertical cavity lasers have numerous advantages over edge-emitting lasers, some of the most important of which are that they can be fabricated in extremely small sizes (e.g., on the order of one micrometer in diameter) and can readily be integrated with other devices such as transistors.

To date, however, applications of vertical cavity lasers have been limited by the absence of any vertical cavity laser which emits visible laser radiation.

SUMMARY OF THE INVENTION

We have invented vertical-cavity lasers which emit laser radiation in the visible region. In these devices, laser radiation can be stimulated by optical pumping or by electrical injection. In a preferred embodiment of the invention, a vertical-cavity surface-emitting laser comprises a laser cavity sandwiched between two distributed Bragg reflectors. The laser cavity comprises a pair of spacer layers surrounding one or more active, optically emitting quantum-well layers having a bandgap in the visible which serve as the active optically emitting material of the device. The thickness of the laser cavity is $m\lambda/2 n_{eff}$ where m is an integer, $\lambda$ is the wavelength of the laser radiation and $n_{eff}$ is the effective index of refraction of the cavity. Electrical pumping of the laser is achieved by heavily doping the bottom mirror and substrate to one conductivity-type and heavily doping regions of the upper mirror with the opposite conductivity type to form a diode structure and applying a suitable voltage to the diode structure.

Specific embodiments of the invention for generating red, green, and blue radiation are described.

BRIEF DESCRIPTION OF THE DRAWING

These and other objects, features and advantages of the invention will be more readily apparent from the following detailed description of the invention in which.

DETAILED DESCRIPTION

Figure 1:
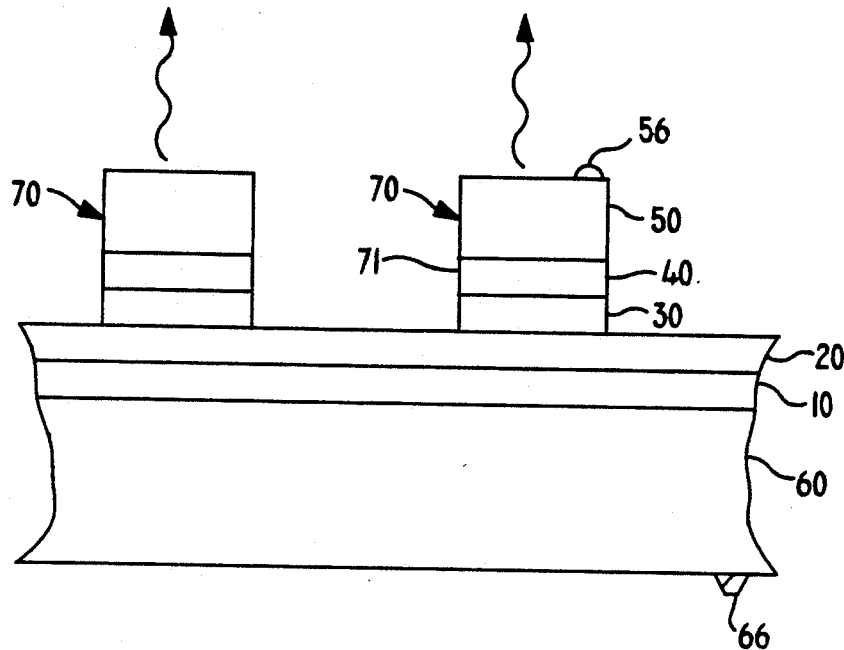
FIG. 1 is a cross-section of a portion of a preferred embodiment of a surface emitting laser of the present invention.

As shown in FIG. 1, the surface emitting laser of the present invention comprises a first mirror layer 10, a first spacer layer 20, a quantum well layer 30, a second spacer layer 40 and a second mirror layer 50. Following techniques known in the art and described, for example, in the above-referenced U.S. Pat. No. 4,949,350, layers 10, 20, 30, and 40 and a portion of layer 50 are epitaxially formed on a substrate 60. The remaining portion of layer 50 is formed by dielectric deposition. As a result, layers 10, 20, 30, 40, and 50 have the same diameter as substrate 60. After epitaxial formation of the layers, well layer 30, spacer layer 40, and mirror layer 50 are defined by optical lithography and etching to form a plurality of columns 70. Electrical contacts to second mirror layer 50 and substrate 60 are provided at 56 and 66.

Figure 8:
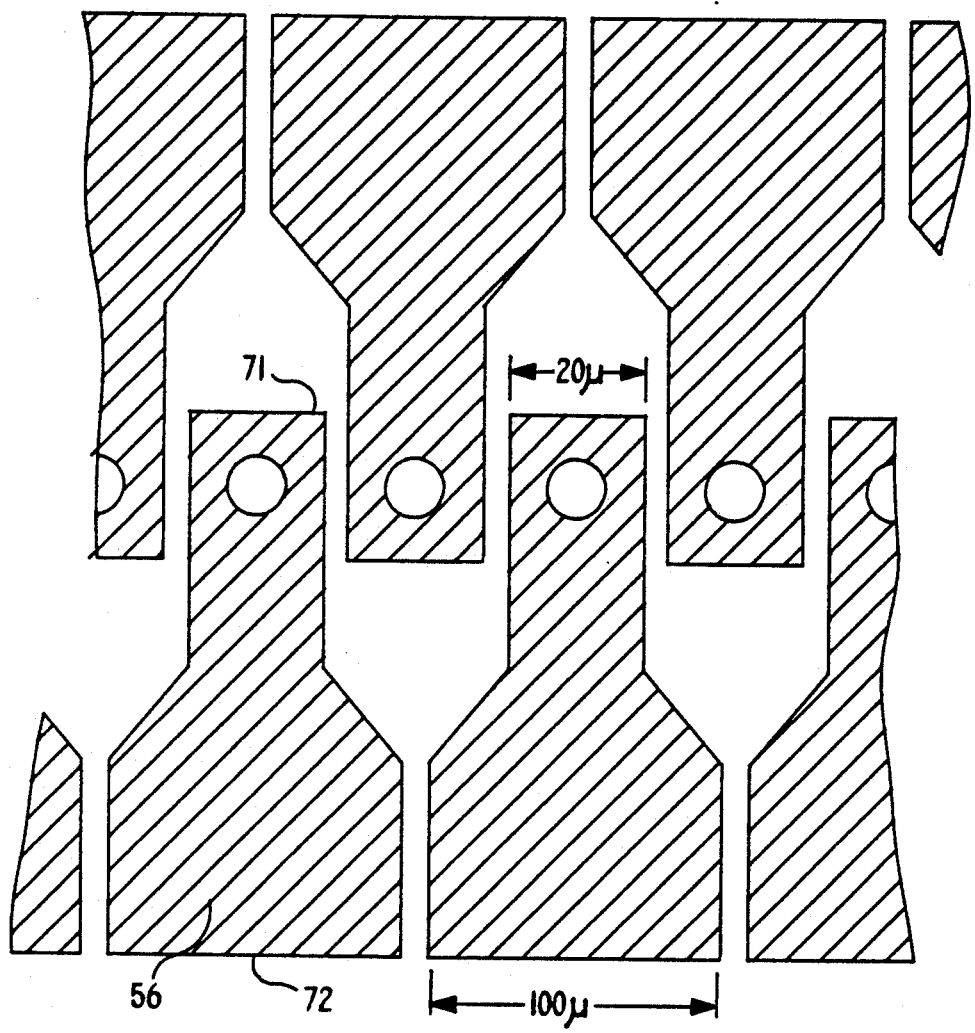
FIG. 8 is a top view of a portion of the surface emitting laser of FIG. 1.

As shown in the top view of FIG. 8, electrical contact 56 is preferably a bonding pad surmounting a portion of column 70. In this case, each column 70 has a first portion 71 (also shown in FIG. 1) that is approximately 20 micrometers on a side and a second portion 72 underneath the bonding pad that is approximately 100 micrometers on a side. Illustratively, substrate 60 has a diameter of 3 or 4 inches (7.5 or 10 cm.) during epitaxial processing and is diced into several units for use.

In a preferred embodiment of the invention which is used to generate red light, substrate 60 is n+ doped GaAs and each of layers 10, 20, 30, 40, and 50 comprises a plurality of layers, the composition of which is illustrated in FIGS. 2–7 and described in more detail below.

Figure 2:
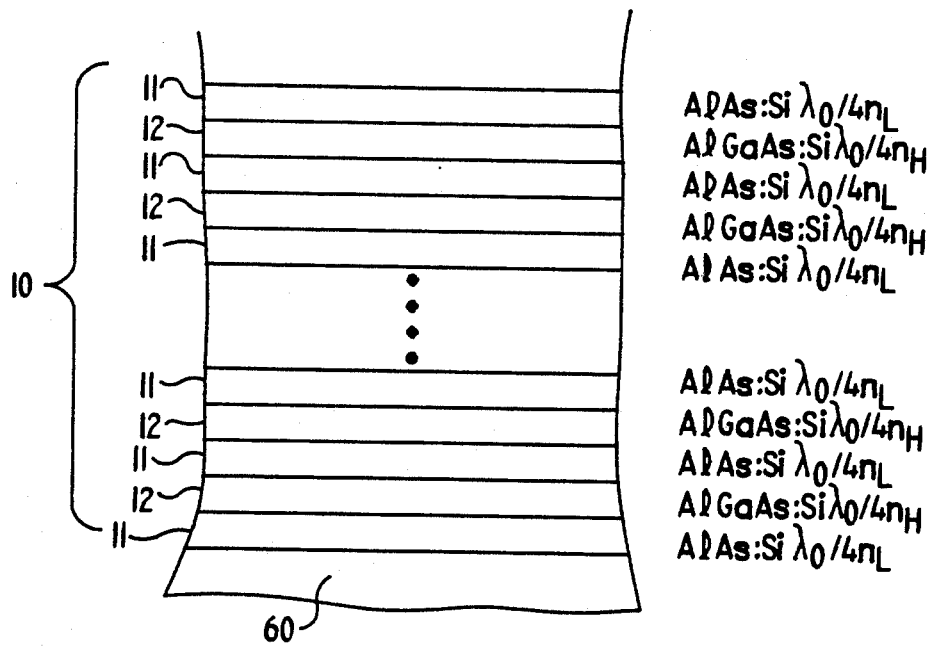
FIGS. 2–7 are cross-sections of different portions of the surface emitting laser of FIG. 1.

As shown in FIG. 2, mirror layer 10 comprises alternating layers 11, 12 of n+ doped AlAs and AlGaAs. Each layer is a quarter-wavelength thick where the wavelength is the wavelength in the layer of the radiation being emitted by the laser. As will be recognized by those skilled in the art, the construction of mirror layer 10 is that of a distributed Bragg reflector in which the AlAs is the layer having the lower index of refraction and AlGaAs is the layer having the higher index of refraction. As is also known, the index of refraction of AlAs is approximately 3.0 depending on the wavelength, and the index of refraction of AlGaAs ranges from approximately 3.0 to 3.6 depending on the wavelength and the relative concentrations of Al and Ga.

Figure 3:
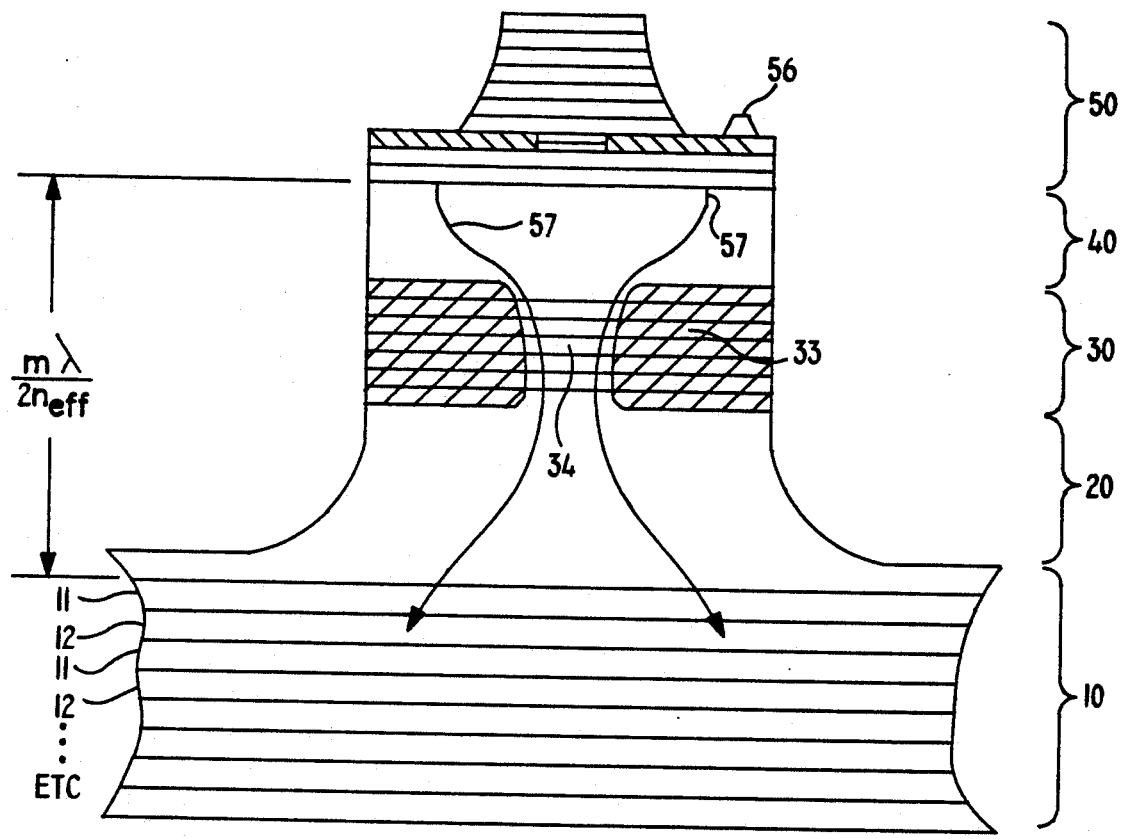

As shown in FIG. 3, the laser cavity comprises spacer layer 20, quantum well layer 30, and spacer layer 40. The length of the laser cavity (which is the thickness of layers 20, 30, and 40) is $m\lambda/2\, n_{eff}$ where $\lambda$ is the free space wavelength of laser radiation emitted, m is an integer and $n_{eff}$ is the effective refractive index of the cavity. Advantageously, an active quantum well 34 is defined by an annular zone 33 of implanted protons which surrounds the active quantum well thereby confining the electrical current flow to the active QW. Details of the use of ion implantation for such current funnelling are set forth in Y. H. Lee, et al., "Top-Surface-Emitting GaAs Four-Quantum-Well Lasers Emitting at 0.85 $\mu$m," *Electron Lett.*, Vol. 26, pp. 1308–1310 (1990) and H.-J. Yoo, et al., "Low Series Resistance Vertical-Cavity Front-Surface-Emitting Laser Diode," *Appl. Phys. Lett.*, Vol. 56, No. 20, pp. 1942–1945 (May 14, 1990), which are incorporated herein by reference.

Figure 4:
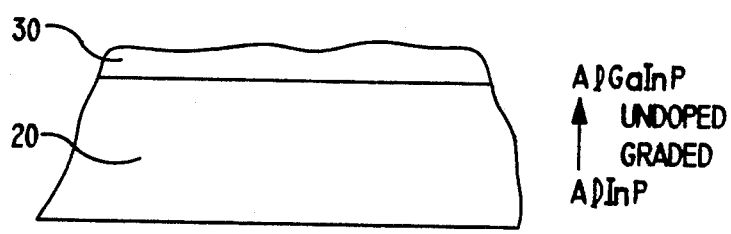
Figure 6:
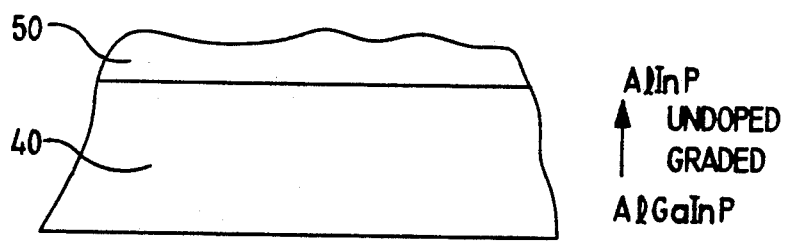

As shown in FIG. 4, spacer layer 20 comprises a plurality of layers of AlGaInP with progressively increasing amounts of Ga toward the quantum well layer. As is known in the art, these layers are lattice matched to GaAs. Also as is known, the index of refraction of these layers increases with increasing amounts of Ga and the bandgap decreases. As shown in FIG. 6, spacer layer 40 is similar in construction with progressively decreasing amounts of Ga toward mirror layer 50.

Figure 5:
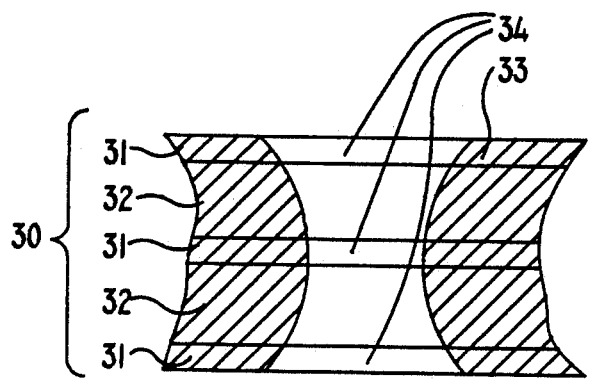

As shown in FIG. 5, quantum well layer 30 comprises three approximately 50 Angstrom thick layers 31 of GaInP separated by two approximately 90 Angstrom thick barrier layers 32 of AlGaInP. A peripheral zone 33 of protons is formed in these layers by implantation. This zone limits the active quantum well to those portions 34 of layers 31 where protons are not implanted. Peripheral zone 33 also confines current flow through the laser diode to the portions of layers 31 and 32 where protons are not implanted and, therefore, increases current density through the quantum well.

Figure 7:
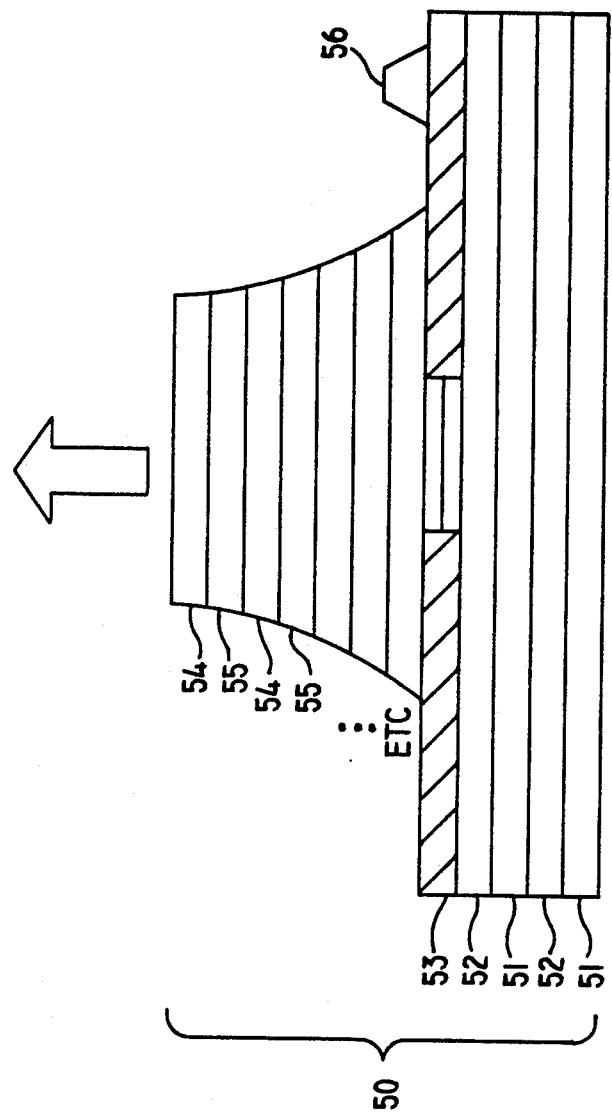

As shown in FIG. 7, second mirror layer 50 comprises a plurality of alternating layers 51, 52 of p+doped AlAs and AlGaAs, a peripheral electrical contact layer 53 of Au and a plurality of alternating layers of 54, 55 of TiO$_2$ and SiO$_2$. Again, each of layers 51 and 52 and layers 54 and 55 are a quarter-wavelength thick and these layers constitute a distributed Bragg reflector. The reflector, however, is partially transmissive to provide for emission of laser radiation from the uppermost layer. Advantageously, the center hole in contact layer 53 is dimensioned so as to restrict the propagation modes of the emitted laser radiation to the TEM$_{00}$ mode.

Preferably, as shown in the top-view of FIG. 8, electrical contact with contact layer 53 is made in conventional fashion through a bonding pad 56 which is formed at the same time as layer 53 on a portion 72 of the epitaxial layers immediately adjacent to the portion 71 of those layers illustrated in FIGS. 2–7.

If desired, the construction of second mirror layer 50 could be the same as that of layer 10. However, the layers of AlAs and AlGaAs have relatively high resistance which results in unwanted heating of the second mirror layer. Accordingly, we have found it advantageous to reduce the resistance of the second mirror layer by including only a few layers of 51, 52 of the mirror within the diode region between electrical contact layer 53 and substrate 60. The remaining layers of the second mirror are formed by dielectric deposition of alternating SiO$_2$ and TiO$_2$ layers on top of contact layer 53.

Individual lasers are formed by defining the devices photolithographically and etching them using known gaseous or chemical etchants.

With appropriate selection of materials and layer dimensions, the laser of FIGS. 1–8 can be used to generate laser radiation in different portions of the visible region of spectrum. The specific embodiment described in conjunction with FIGS. 1–8 can be used to generate radiation in the red region.

To generate radiation in the yellow to green portion of the spectrum, the active quantum well layers preferably should be made of AlGaP and the barrier layers of AlGaP where different compositions of Al and Ga are used for the quantum well layers and barriers. The second mirror should be made of alternating layers of AlGaP and AlP.

To generate radiation in the blue portion of the spectrum, the active quantum well layers preferably should be made of AlGaN and the barrier layers of AlGaN where different compositions of Al and Ga are used for the quantum well layers and barriers. The second mirror should be made of alternating layers of AlGaN and AlN.

Numerous variations in the invention will be apparent to those skilled in the art from the foregoing description. For example, other material combinations from the III-V and II-VI semiconductor groups such as ZnCdSe can be used in place of the materials specified for the quantum well layers, spacer layers and mirror layers.

What is claimed is:

1. A vertical cavity, surface emitting laser that emits radiation having a wavelength in the range between 600 and 700 nanometers comprising:
    a substrate,
    a first mirror comprising a plurality of layers formed on said substrate, each layer having a thickness of $\lambda/4\, n$ where n is the index of refraction of the layer,
    a first spacer, formed on said first mirror,
    an active layer comprising at least one quantum well layer of GaInP formed on said first spacer,
    a second spacer formed on said active layer, and
    a second mirror comprising a plurality of layers formed on said second spacer, each layer having a thickness of $\lambda/4\, n$,
    said first and second mirrors defining therebetween a laser cavity having a length equal to $m\lambda/2\, n_{eff}$ where m is an integer and $n_{eff}$ is the effective index of refraction of the laser cavity, and said first and said second mirrors are of alternating layers of AlGaAs and AlAs,
    said second spacer and said second mirror being made of materials that are transmissive to radiation having a wavelength of $\lambda/n$.

2. The laser of claim 1 wherein at least the first mirror and the second mirror are doped with dopants of opposite conductivity type to form a diode structure and the laser further comprises first and second electrodes for applying a biasing voltage to the diode structure.

3. The laser of claim 2 wherein said second mirror has fewer layers than said first mirror of alternating layers of AlGaAs and AlAs between said substrate and one of sad electrodes thereby reducing the resistance of said second mirror.

4. The laser of claim 1 wherein the laser is optically pumped by radiation having a wavelength that is shorter than radiation emitted by the laser.

* * * * *